(12) United States Patent
David

(10) Patent No.: US 11,326,904 B2
(45) Date of Patent: May 10, 2022

(54) MEASUREMENT OF A RELATIVE POSITION OF MOVABLE ELEMENTS

(71) Applicant: SAFRAN ELECTRONICS & DEFENSE, Paris (FR)

(72) Inventor: Camille David, Boulogne-Billancourt (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 17/297,590

(22) PCT Filed: Nov. 20, 2019

(86) PCT No.: PCT/FR2019/052769
§ 371 (c)(1),
(2) Date: May 27, 2021

(87) PCT Pub. No.: WO2020/109699
PCT Pub. Date: Jun. 4, 2020

(65) Prior Publication Data
US 2022/0026245 A1    Jan. 27, 2022

(30) Foreign Application Priority Data

Nov. 29, 2018 (FR) ...................................... 1872039

(51) Int. Cl.
*G02B 7/02* (2021.01)
*G01D 5/20* (2006.01)
*G01R 33/06* (2006.01)

(52) U.S. Cl.
CPC ........... *G01D 5/2046* (2013.01); *G01R 33/06* (2013.01); *G02B 7/02* (2013.01)

(58) Field of Classification Search
CPC ...... G01D 5/2046; G01R 33/06; G01R 33/02; G02B 7/02; G02B 7/04; G02B 7/10; G02B 7/285
(Continued)

(56) References Cited

U.S. PATENT DOCUMENTS 9,279,703 B2 * 3/2016 Nakamura ............. G01D 5/347
2005/0285026 A1 12/2005 Kawai et al.
(Continued)

FOREIGN PATENT DOCUMENTS

FR    2882140 A1    8/2006

OTHER PUBLICATIONS

International Search Report dated Mar. 5, 2020, issued in corresponding International Application No. PCT/FR2019/052769, filed Nov. 20, 2019, 2 pages.
(Continued)

*Primary Examiner* — William R Alexander
(74) *Attorney, Agent, or Firm* — Christensen O'Connor Johnson Kindness PLLC

(57) ABSTRACT

An assembly for measuring a relative position of two movable elements with respect to one another. The assembly includes a ribbon having a magnetic strip, and two magnetic sensors. The ribbon is intended to be fastened to one of the two elements, and the magnetic sensors both to be fastened to the other element. One of the two magnetic sensors serves to precisely measure a relative position of the two elements within a period of orientation alternation of magnetic poles, and the other magnetic sensor serves to define an origin of the measurements in order to obtain an absolute-measurement result for the relative position of the two elements with respect to one another.

9 Claims, 1 Drawing Sheet

(58) Field of Classification Search
USPC .......................................................... 359/819
See application file for complete search history.

(56) References Cited

U.S. PATENT DOCUMENTS

| | | |
|---|---|---|
| 2006/0186879 A1 | 8/2006 | Legrand |
| 2010/0327152 A1 | 12/2010 | Bahari et al. |
| 2013/0096862 A1* | 4/2013 | Nakamura ............. G01D 5/347 |
| | | 702/94 |

OTHER PUBLICATIONS

Written Opinion of the International Searching Authority dated Mar. 5, 2020, issued in corresponding International Application No. PCT/FR2019/052769, filed Nov. 20, 2019, 6 pages.

Written Opinion of the International Searching Authority dated Mar. 5, 2020, issued in corresponding International Application No. PCT/FR2019/052769, filed Nov. 20, 2019, 7 pages.

International Preliminary Report on Patentability dated May 25, 2021, issued in corresponding International Application No. PCT/FR2019/052769, filed Nov. 20, 2019, 1 page.

* cited by examiner

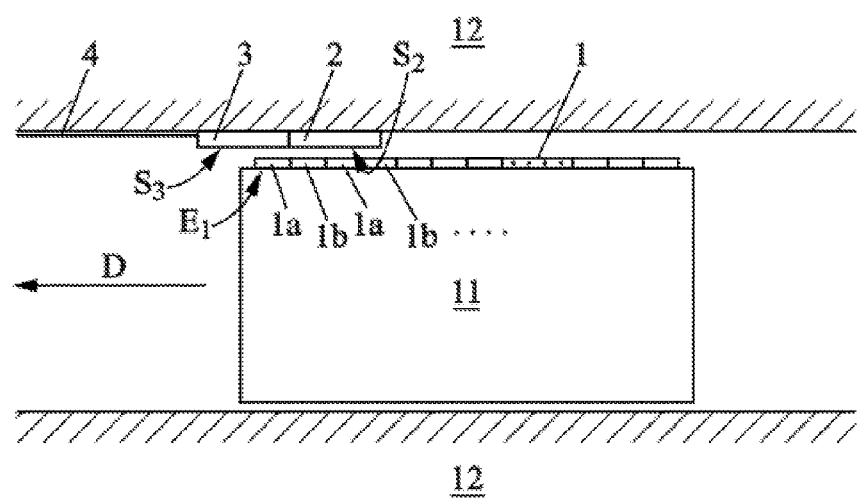

MEASUREMENT OF A RELATIVE POSITION OF MOVABLE ELEMENTS

TECHNICAL FIELD

The invention relates to the measurement of a relative position of two movable elements.

PRIOR ART

Characterizing, with requisite accuracy, the relative position of two elements which are intended to move with respect to one another, is a common requirement. In particular, there is often a need for such a measurement to be performed within a device which incorporates moving elements, without access from the outside of the device, and also sometimes for the position measurement to be performed during operation of the device. Such is the case in an optical device when it is necessary to know, in real time, the position of a block of lenses with respect to the rest of the device. For example, autofocus systems in imaging devices require a real time knowledge of the position of the moving focusing lenses, with respect to a fixed optical part or with respect to an image sensor.

The measurement accuracy requirements vary between applications which are different. However, accuracies less than 10 µm (micrometer) for travels of several millimeters are often necessary. Furthermore, some applications require the same measurement to be repeated at a fairly high frequency, for example at more than 1000 Hz (hertz), to characterize and/or control the relative position of the two elements which are movable with respect to one another with sufficient accuracy. Such a requirement can exist when at least one of the two elements may be subject to vibrations, even impacts, and in particular when the position measurement system is incorporated in the device without access from the outside.

Many position measurement systems already exist, including mechanical systems, optical systems, systems based on electrically resistive elements, and so on. However, most of these measurement systems are not compatible with a combination of the following requirements:

a measurement system which is not bulky and is inexpensive;

a measurement accuracy which is less than 10 µm;

measurement operation which is efficient in the presence of vibrations;

a measurement system resistant to impacts.

There are notable assemblies for measuring the relative position of two elements which are movable with respect to one another, such that each measurement assembly comprises:

a ribbon, which has a longitudinal extension and which comprises, parallel to this longitudinal extension, a magnetic strip with magnetic poles in which the individual orientations of the poles are fixed and alternated periodically along the strip, from one end of this strip; and a first magnetic sensor, which is capable of detecting a passage of magnetic poles in which the respective orientations are different between two successive poles, in front of a sensitive surface of this first sensor when the ribbon is secured to a first of the two elements and the first sensor is secured to the other of the two elements, the position being measured within a period of alternation of the orientations of the magnetic poles along the strip of the ribbon.

However, such a measurement assembly presents the drawback of not being able to differentiate positions of the two elements with respect to one another, which are different by an integer number of times the period of alternation of the orientations of the magnetic poles, parallel to the longitudinal extension of the ribbon. Then, in case of impact which affects the two elements differently, it is possible to lose the ongoing count of the alternations of orientation of the magnetic poles. The subsequent measurements then exhibit an uncertainty which is equal to a multiple of the period of alternation of the orientation of the magnetic poles along the strip. A procedure for recalibrating the measurement assembly is then necessary, with a return of the device incorporating the measurement assembly to the laboratory.

Technical Problem

From this situation, one aim of the present invention is to have novel position measurement assemblies which do not present the drawbacks mentioned previously, or for which at least some of these drawbacks are reduced.

SUMMARY OF THE INVENTION

To achieve this aim, or another, a first aspect of the invention proposes a novel assembly for measuring a relative position of two elements that are movable with respect to one another, which is of the type with ribbon and magnetic sensor as indicated above. However, according to the invention, this measurement assembly further comprises, in addition to the first magnetic sensor:

a second magnetic sensor, which is capable of detecting a passage of at least one magnetic pole of the end of the magnetic strip of the ribbon, or of at least two successive magnetic poles of said end of the magnetic strip of the ribbon and in which the respective orientations are different, in front of a sensitive surface of this second sensor when it is secured to the same one of the two elements as the first sensor.

Thus, the second magnetic sensor is capable of detecting a position of the end of the magnetic strip, when this end is brought in front of its sensitive surface. A measurement value is then assigned to the relative position of the two movable elements, which corresponds to this measurement by the second magnetic sensor. Subsequent positions of the two movable elements can then be measured by continuously counting the travel of the alternations of orientation of the magnetic poles in front of the sensitive surface of the first magnetic sensor. Thus, the second magnetic sensor provides a measurement reference, also called measurement origin, which can be retrieved as required, for example after a significant vibration or an impact likely to cause a jump in the succession of the alternations of orientation of the magnetic poles as detected by the first magnetic sensor. The first magnetic sensor each time resumes the counting of the alternations of orientation of magnetic poles from the last reference supplied by the second magnetic sensor. In other words, the second magnetic sensor provides a position measurement origin, which is available in situ within the device which incorporates the two elements that are movable with respect to one another and the position measurement assembly according to the invention. Thus, the assembly of the invention makes it possible to obtain absolute measurement results for the relative position of the two elements with respect to one another. That of the two elements which bears the two magnetic sensors can serve as position reference, and the position of the other element, which bears the ribbon, can be measured in absolute terms with respect to the element of the two sensors.

In possible embodiments of the invention, the second magnetic sensor can comprise means for detecting an intensity of a magnetic field which is created by the magnetic strip of the ribbon in this second sensor. Then, the second sensor is suitable for detecting the position of the end of the magnetic strip of the ribbon, parallel to the longitudinal extension thereof, by comparing the intensity of the magnetic field to at least one threshold. In particular, the interruption of the alternation of the magnetic poles at the end of the magnetic strip of the ribbon provokes a reduction of the magnetic field which is generated by the ribbon in the second sensor. It is this reduction which is detected by the second magnetic sensor, when the intensity of the magnetic field becomes less than or greater than the threshold, depending on the direction of the passage of the end of the strip in front of the second magnetic sensor. The crossing of the threshold thus makes it possible to define a reference magnetic pole which is linked to the ribbon, and from which the passage of the magnetic poles is counted continuously to obtain the absolute position measurement.

In preferred embodiments of the invention, at least one of the following additional features can optionally be reproduced, alone or in combination with several of them:

the second magnetic sensor can be suitable for determining a position of the end of the magnetic strip of the ribbon, parallel to the longitudinal extension of the ribbon, with an uncertainty which is less than a half-period of the alternation of the orientations of the magnetic poles along the strip of the ribbon;

the period of alternation of the orientations of the magnetic poles along the strip of the ribbon can be less than or equal to 2.5 mm, for example equal to 2 mm;

the first magnetic sensor can be suitable for determining a position of a segment of the magnetic strip of the ribbon, parallel to the longitudinal extension of this ribbon, with an uncertainty which is less than 10 μm, preferably less than 5 μm, within the period of alternation of the orientations of the magnetic poles along the strip of the ribbon;

the first magnetic sensor can be suitable for measuring a position of the magnetic poles in front of its sensitive surface, within the period of alternation of the orientations of the magnetic poles along the strip of the ribbon, at a frequency which is greater than 3000 Hz, preferably greater than or equal to 4000 Hz; and the first and second magnetic sensors can be identical, the first sensor being disposed within the measurement assembly to operate in linear mode in order to measure the position of the magnetic poles in front of its sensitive surface within the period of alternation of the orientations of the magnetic poles along the strip of the ribbon, and the second sensor being disposed within the measurement assembly to operate in nonlinear mode in order to detect the passage, in front of the sensitive surface of this second sensor, of at least one magnetic pole of the end of the magnetic strip of the ribbon, or of at least two successive magnetic poles of this end of the magnetic strip of the ribbon and whose respective orientations are different.

In particular, the possibility for the first magnetic sensor to perform measurements of the position of the magnetic poles of the ribbon at a frequency which is sufficiently high, makes it possible to track the displacements of the two elements with respect to one another which are rapid, even very rapid. In fact, a continual or quasi-continual tracking of the displacement of the two elements with respect to one another is thus possible, which makes it possible not to miss the passage of an alternation of poles in front of the first magnetic sensor between two successive measurements. It is not then necessary to proceed with a new passage of the end of the magnetic strip of the ribbon in front of the second magnetic sensor to reset the origin of the position measurements with respect to the end of the ribbon. Such rapid or very rapid displacements of the two elements with respect to one another can be caused by impacts, in particular.

A second aspect of the invention proposes a method for measuring a relative position of two elements, this method comprising the following steps:

fixing, onto the second of the two elements, the first magnetic sensor of a measurement assembly which is in accordance with the first aspect of the invention;

fixing the ribbon of the measurement assembly onto the first of the two elements, such that the ribbon travels continuously in front of the sensitive surface of the first sensor when the two elements are movable with respect to one another, with a component of relative displacement of the two elements at the ribbon level which is not at right angles to the longitudinal extension of the ribbon; and fixing the second magnetic sensor onto the second element, in addition to the first sensor, such that there is at least one relative position of the two elements for which the sensitive surface of the second magnetic sensor is facing the end of the magnetic strip of the ribbon, and for which the sensitive surface of the first magnetic sensor is simultaneously facing a part of the magnetic strip of the ribbon, away from its end.

The invention can advantageously be used in applications in which one of the two elements comprises a movable block with one or more optical lenses, the other of the two elements comprises a mount serving as support for the movable block with lenses. The two elements and the measurement assembly can then belong to one optical device.

In other possible applications of the invention, one of the two elements can comprise a movable counterweight, the other of the two elements can comprise a mount serving as support for the movable counterweight. The two elements and the measurement assembly can then belong to one dynamic balancing device.

BRIEF DESCRIPTION OF THE DRAWINGS

The features and advantages of the present invention will become more clearly apparent from the following detailed description of a nonlimiting exemplary embodiment, with reference to the following single figure which is attached:

FIG. 1 is a view in longitudinal cross-section of a device with two movable elements which incorporates a position measurement assembly in accordance with the invention.

DETAILED DESCRIPTION OF THE INVENTION

For clarity, the dimensions of the elements which are represented in this figure correspond neither to real dimensions, nor to real dimensional ratios. Furthermore, some of these elements are represented only symbolically.

In [FIG. 1], the reference 11 designates a movable block and the reference 12 designates a mount. The mount 12 has a support function for the block 11, and is such that the block 11 can be displaced with respect to the mount 12. Possibly, the mount 12 can further have a function of guiding of the displacement of the block 11, but this guiding function can, alternatively, be produced by other elements that are not represented. Thus, the block 11 can be displaced by translation according to the arrow D with respect to the mount 12, for example from the relative position of the two elements 11 and 12 as represented in the figure. A system for moving and driving the block 11, not represented, makes it possible to produce its displacement with respect to the mount 12. As a nonlimiting illustration, the block 11 can comprise at least one optical lens, or a counterweight depending on the application of the invention.

The assembly for measuring the position of the block 11 with respect to the mount 12 comprises a ribbon with magnetic strip 1, a first magnetic sensor 2 and a second magnetic sensor 3. If necessary, a communication link 4 based on electrical signals can link the two sensors 2 and 3 to a controller that is not represented. The link 4 can also ensure the electrical power supply for the sensors 2 and 3. Alternatively, the two sensors 2 and 3 can be suitable for transmitting measurement signals by a wireless communication system.

The ribbon with magnetic strip 1 is fixed onto the block 11, and disposed parallel to the direction of the displacement D. It comprises a magnetic strip which consists of an alignment, parallel to the direction D, of magnetic dipoles which are oriented alternately in two different directions. For example, the magnetic dipoles 1a and 1b have their north-south axes oriented at right angles to the ribbon 1, that is to say at right angles to the surface of the block 11 on which the ribbon 1 is glued flat. In this case, the magnetic dipoles 1a can have their north poles turned toward the outside of the block 11, and the magnetic dipoles 1b can have their north poles turned in the opposite direction, that is to say toward the interior of the block 11. Other orientations of the magnetic dipoles 1a and 1b are also possible, for example with their north-south axes which are parallel to the surface of the block 11 on which the ribbon 1 is glued flat, but also reversed between two magnetic dipoles which follow one another in the direction D. The period of the dipoles 1a and 1b, taking into account their alternate orientations, can be 2 mm (millimeters) for example. Materials suitable for constituting such a magnetic strip of the ribbon 1 are known to the person skilled in the art, notably based on rare earth compounds.

For example, the magnetic strip of the ribbon 1 can have a length which is between 4 mm (millimeters) and 50 mm, and a width of the order of 10 mm. Notably, the magnetic strip of the ribbon 1 can have a length which is equal to the length of the useful travel of the displacement of the block 11 with respect to the mount 12, increased by a margin, for example of 3 mm, in order to guarantee a linearity of the measurements over the entire useful displacement travel.

The two magnetic sensors 2 and 3 can be identical, with modes of operation selected for each of them which are different. They each comprise a sensitive surface, $S_2$ for the sensor 2 and $S_3$ for the sensor 3, to be disposed facing the magnetic strip of the ribbon 1, for example at 0.2 mm therefrom. The sensitive surface of each sensor can be composed of one or more separate magnetic receivers, for example of the Hall-effect receiver type. Each receiver perceives the orientation of that or those of the magnetic dipoles of the ribbon 1 which is or are immediately facing it. It then delivers a measurement signal which characterizes a position, with respect to this receiver and in the direction D, of a pattern of two successive magnetic dipoles. For example, such a magnetic pattern can be a dipole 1a which is continuous with and just to the left of a dipole 1b. It is denoted 1a-1b hereinbelow. The length, in the direction D, of the sensitive surface $S_2$ (respectively $S_3$) of the sensor 2 (respectively 3) is generally greater than or equal to the period, also in the direction D, of alternation of orientation of the magnetic dipoles. Preferably, it can be equal to a multiple of this period, for example three times this period. In these conditions, magnetic sensors which are commercially available have an accuracy of measurement of the position of the magnetic pattern 1a-1b of 5 μm, with respect to a central point of each sensitive sensor surface. For example, the position of the magnetic pattern 1a-1b can be coded numerically between −2048 and +2047. The magnetic sensor 2, called "position coder", is used according to this so-called linear mode of operation.

The magnetic sensor 3, called "origin coder", can be used according to a different, so-called non-linear mode of operation and intended to identify a position of a first magnetic dipole or of a first magnetic pattern at the end $E_1$ of the strip of the ribbon 1, in front of its sensitive surface $S_3$. The magnetic sensor 3 then determines the position of the end $E_1$ of the ribbon 1 according to the position of an asymmetrical magnetic field edge, for example also with respect to the central point of its sensitive surface $S_3$. A measurement method based on comparison of a detected amplitude with a fixed threshold can be used for that. In an alternative mode of operation of the magnetic sensor 3, the end $E_1$ of the magnetic strip of the ribbon 1 can be detected by the magnetic sensor 3 by measuring an average value of a magnetic field, or an amplitude of a Fourier component of the magnetic field with respect to a spatial coordinate parallel to the direction D, such that this magnetic field is generated by the magnetic strip in the magnetic sensor 3. A decrease in this average value or measured amplitude below a fixed threshold, or an overshoot of the threshold by the average value or measured amplitude, characterizes the passage of the end $E_1$ of the magnetic strip of the ribbon 1 at an identified point of the magnetic sensor 3. The accuracy of such measurements of position of the end $E_1$, for the modes of operation described for the magnetic sensor 3, is less fine than that of the mode of operation of the magnetic sensor 2. However, it is less than the half-period, parallel to the direction D, of the alternation of orientation of the dipoles 1a and 1b. Thus, the magnetic sensor 3 makes it possible to eliminate an indeterminacy as to which of the successive magnetic patterns 1a-1b is located in front of the sensitive surface $S_2$ of the magnetic sensor 2 when the end $E_1$ of the strip of the ribbon 1 is simultaneously in front of the sensitive surface $S_3$ of the magnetic sensor 3. For example, the accuracy of the magnetic sensor 3 for determining the position of the end $E_1$ of the ribbon 1 may be only 40 μm or more. When the block 11 is displaced according to the arrow D such that the end $E_1$ of the strip of the ribbon 1 is no longer facing the sensitive surface $S_3$ of the magnetic sensor 3, the position of the ribbon 1 is determined by counting, during the displacement, the periods of variation of the measurement signal which is delivered by the magnetic sensor 2. These periods are associated with the scrolling of successive, complete then partial, magnetic patterns 1a-1b. The accuracy of such a measurement mode is then obtained by the linear mode of operation of the magnetic sensor 2. It is not therefore necessary for the sensors 2 and 3 to be positioned accurately with respect to one another in the direction D, as long as this accuracy is less than the period of alternation of orientation of the magnetic dipoles.

This measurement accuracy, which is obtained by the magnetic sensor 2, is obtained for any positions of the block 11 with respect to the mount 12 as long as the sensitive surface $S_2$ of the magnetic sensor 2 remains entirely facing a part of the ribbon 1. In other words, it is necessary, for that, for the ribbon to have a portion of useful length which remains constantly facing the sensitive surface $S_2$ of the magnetic sensor 2, and for the magnetic sensor 3 to be offset in the direction D with respect to the magnetic sensor 2 such that a displacement of the block 11 makes it possible to bring the end $E_1$ of the strip of the ribbon 1 facing the magnetic sensor 3.

Models of magnetic sensors are commercially available which make it possible to perform measurements at a frequency of between 100 Hz and 5000 Hz. Measurements which are performed at a frequency greater than 3000 Hz, for example at at least 4000 Hz, make it possible to track in time—or temporally resolve as a person skilled in the art might say—impacts likely to be undergone by the block 11 and which would produce sudden offsets thereof with respect to the mount 12.

However, in the event of an impact that is too fast or for any other reason which would necessitate recounting the patterns which have already scrolled in front of the sensitive surface $S_2$ of the magnetic sensor 2 from a position in which the end $E_1$ of the track of the ribbon 1 is in front of the sensitive surface $S_3$ of the magnetic sensor 3, it is sufficient to order a displacement of the block 11 until the end $E_1$ of the strip of the ribbon 1 passes once again in front of the sensitive surface $S_3$ of the magnetic sensor 3. The count of the scrolling of the magnetic patterns 1a-1b is then resumed at its beginning from the moment where the position of the end $E_1$ is determined by the magnetic sensor 3. However, when the possibility of an excessively rapid impact is foreseeable, it may be preferable to increase the measurement frequency of the magnetic sensor 2 to also resolve this impact temporally, and thus avoid a period of time devoted to a recounting of the magnetic patterns 1a-1b from the end $E_1$ of the strip of the ribbon 1.

It is understood that the invention can be reproduced by modifying secondary aspects of the embodiment which has been described in detail hereinabove, while retaining at least some of the advantages cited. Notably, the two magnetic sensors can be disposed side-by-side or spaced apart from one another in the direction of displacement D. However, they can preferably be side-by-side to reduce a total length of the ribbon 1, and reduce a footprint of the position measurement assembly within the device which comprises the block 11, the mount 12 and this position measurement assembly.

Finally, although the description has taken the example of fixing the ribbon 1 onto the movable block 11 and the two magnetic sensors 2 and 3 on the mount 12, the reverse can equally be envisaged.

The invention claimed is:

1. An assembly for measuring a relative position of two elements that are movable with respect to one another, said assembly comprising:
    a ribbon, which has a longitudinal extension and which comprises, parallel to this longitudinal extension, a magnetic strip with magnetic poles in which the individual orientations of the poles are fixed and alternated periodically along the strip, from one end of said strip;
    a first magnetic sensor, which is capable of measuring a position of magnetic poles whose respective orientations are different between two successive poles, in front of a sensitive surface of the first magnetic sensor when the ribbon is secured to a first of the two elements and the first magnetic sensor is secured to the other of said two elements, the position being measured within a period of alternation of the orientations of the magnetic poles along the strip of the ribbon; and
    a second magnetic sensor, which is capable of detecting a passage of at least one magnetic pole of the end of the magnetic strip of the ribbon, or of at least two successive magnetic poles of said end of the magnetic strip of the ribbon and whose respective orientations are different, in front of a sensitive surface of the second magnetic sensor, when said second magnetic sensor is secured to said other of the two elements with said first magnetic sensor.

2. The measurement assembly of claim 1, wherein the second magnetic sensor is suitable for determining a position of the end of the magnetic strip of the ribbon, parallel to the longitudinal extension of said ribbon, with an uncertainty which is less than a half-period of alternation of the orientations of the magnetic poles along the strip of said ribbon.

3. The measurement assembly of claim 1, wherein the second magnetic sensor comprises means for detecting an intensity of a magnetic field which is created by the magnetic strip of the ribbon in said second magnetic sensor, and said second magnetic sensor is suitable for detecting the position of the end of the magnetic strip of the ribbon, parallel to the longitudinal extension of said ribbon, by comparing the intensity of the magnetic field to at least one threshold.

4. The measurement assembly of claim 1, wherein the period of alternation of the orientations of the magnetic poles along the strip of the ribbon is less than or equal to 2.5 mm.

5. The measurement assembly of claim 1, wherein the first magnetic sensor is suitable for determining a position of a segment of the magnetic strip of the ribbon, parallel to the longitudinal extension of said ribbon, with an uncertainty which is less than 10 µm, within a period of alternation of the orientations of the magnetic poles along said strip of the ribbon.

6. The measurement assembly of claim 1, wherein the first magnetic sensor is suitable for measuring a position of the magnetic poles in front of the sensitive surface of said first magnetic sensor, within a period of alternation of the orientations of the magnetic poles along the strip of the ribbon, at a frequency greater than 3000 Hz.

7. A method for measuring a relative position of first and second elements with the measurement assembly of claim 1, said method comprising:
    fixing, onto the second element, the first magnetic sensor of the measurement assembly;
    fixing the ribbon of the measurement assembly onto the first element, such that the ribbon runs continuously in front of the sensitive surface of the first magnetic sensor when the first and second elements are movable with respect to one another, with a component of relative displacement of the first and second elements at the ribbon level which is not at right angles to the longitudinal extension of said ribbon; and
    fixing the second magnetic sensor onto the second element, in addition to said first magnetic sensor, such that there is at least one relative position of the first and second elements for which the sensitive surface of the second magnetic sensor is facing the end of the magnetic strip of the ribbon, and for which the sensitive surface of the first magnetic sensor is simultaneously facing a part of a magnetic strip of the ribbon, which is away from the end of the magnetic strip.

8. The method of claim 7, whereby one of the first and second elements comprises a movable block with at least one optical lens, and the other of the first and second elements comprises a mount serving as support for said movable block, the first and second elements and the measurement assembly belonging to an optical device.

9. The method of claim 7, whereby one of the first and second elements comprises a movable counterweight, and the other of the first and second elements comprises a mount serving as support for the movable counterweight, the first and second elements and the measurement assembly belonging to a dynamic balancing device.

* * * * *